US008299779B2

(12) United States Patent
Kern

(10) Patent No.: US 8,299,779 B2
(45) Date of Patent: Oct. 30, 2012

(54) DEVICE FOR MEASURING THE INTENSITY OF AN ELECTRIC CURRENT AND ELECTRIC APPLIANCE INCLUDING SUCH DEVICE

(75) Inventor: Christian Kern, Sigolsheim (FR)

(73) Assignee: Socomec S. A., Benfeld (FR)

( * ) Notice: Subject to any disclaimer, the term of this patent is extended or adjusted under 35 U.S.C. 154(b) by 110 days.

(21) Appl. No.: 12/676,751

(22) PCT Filed: Sep. 9, 2008

(86) PCT No.: PCT/IB2008/002332
§ 371 (c)(1),
(2), (4) Date: Mar. 5, 2010

(87) PCT Pub. No.: WO2009/034440
PCT Pub. Date: Mar. 19, 2009

(65) Prior Publication Data
US 2010/0301836 A1 Dec. 2, 2010

(30) Foreign Application Priority Data
Sep. 10, 2007 (FR) ...................................... 07 06309

(51) Int. Cl.
*G01R 15/18* (2006.01)
(52) U.S. Cl. ................. 324/127; 324/117 H; 324/117 R; 336/200
(58) Field of Classification Search .................... None
See application file for complete search history.

(56) References Cited

U.S. PATENT DOCUMENTS

| 4,980,794 | A |  | 12/1990 | Engel |
|---|---|---|---|---|
| 5,177,433 | A |  | 1/1993 | Schwendtner et al. |
| 5,296,802 | A |  | 3/1994 | Beranger et al. |
| 5,414,400 | A | * | 5/1995 | Gris et al. .................... 336/174 |
| 5,430,613 | A | * | 7/1995 | Hastings et al. .............. 361/760 |
| 5,453,681 | A |  | 9/1995 | Berkcan et al. |
| 5,617,019 | A | * | 4/1997 | Etter ......................... 324/117 R |
| 6,043,641 | A | * | 3/2000 | Singer et al. .................. 324/127 |
| 6,380,727 | B1 | * | 4/2002 | Jitaru ......................... 324/117 R |
| 6,441,605 | B1 |  | 8/2002 | Baurand et al. |
| 6,680,608 | B2 | * | 1/2004 | Kojovic ........................ 324/127 |
| 6,822,547 | B2 | * | 11/2004 | Saito et al. .................... 336/200 |
| 7,109,838 | B2 | * | 9/2006 | Brennan et al. ............... 336/200 |

(Continued)

FOREIGN PATENT DOCUMENTS

DE 19606445 8/1996
(Continued)

*Primary Examiner* — Richard Isla Rodas
(74) *Attorney, Agent, or Firm* — Davis & Bujold, PLLC

(57) ABSTRACT

A device for measuring the intensity of an electric current which has a simple and economical design and offers a high measurement dynamic compatible with combined measurement, protection and energy metering applications. The device (1) is insensitive to parasitic fields and to the position of the electric conductor to be measured, and that can be opened to facilitate placement thereof. The device (1) defines a closed path (C), about a conductor (2) for the circulation of the lines of magnetic field induced by the current to be measured, and the path is formed by two plates (30) having a high magnetic permeability separated by two air gaps (E) closed by two identical and opposed electric coils (4) for supplying a voltage proportional to the derivative of the intensity (I) of the current to be measured. The device (1) reduces the is compact so that it can be easily integrated into any type of electric appliance.

19 Claims, 4 Drawing Sheets

U.S. PATENT DOCUMENTS

| | | | |
|---|---|---|---|
| 7,129,692 B2 * | 10/2006 | Omura et al. | 324/117 R |
| 7,227,442 B2 * | 6/2007 | Skendzic | 336/229 |
| 7,307,410 B2 * | 12/2007 | Shiokawa et al. | 324/76.11 |
| 7,532,000 B2 * | 5/2009 | Kovach et al. | 324/117 H |
| 7,538,541 B2 * | 5/2009 | Kojovic | 324/127 |
| 2007/0252577 A1 | 11/2007 | Preusse | |

FOREIGN PATENT DOCUMENTS

| | | |
|---|---|---|
| EP | 0438616 | 7/1991 |
| EP | 0519804 | 12/1992 |
| EP | 1074846 | 2/2001 |
| EP | 1450176 | 8/2004 |
| EP | WO2005/106506 | 11/2005 |

* cited by examiner

DEVICE FOR MEASURING THE INTENSITY OF AN ELECTRIC CURRENT AND ELECTRIC APPLIANCE INCLUDING SUCH DEVICE

This application is a national stage completion of PCT/IB2008/002332 filed on Sep. 9, 2008 which claims priority from French Application Serial No. 07/06309 filed on Sep. 10, 2007.

Technical Domain

The present invention concerns a device for measuring the intensity of an electric current comprising at least one magnetic circuit disposed near an electric conductor traversed by a current to be measured in order to channel the magnetic field induced around the conductor by the current to be measured, at least one electric coil associated with the magnetic circuit to deliver voltage proportional to the derivative of the intensity of the current to be measured, and at least one voltage processing module to deliver the value of the measured intensity. The invention also concerns an electric apparatus equipped with such a device, the electrical apparatus possibly consisting of a shutoff device such as a switch, a commutator switch, a circuit breaker, or any other equivalent monophase or polyphase device, with or without a neutral.

Prior Art

Several types of devices exist for measuring the intensity of an alternating current passing through an electric conductor. The best known ones are doubtless current transformers, which use a magnetic torus mounted on each electrical conductor forming the primary of the transformer, and a coil wrapped around the torus forming the secondary of the transformer and delivering a voltage signal proportionate to the intensity measured. However, these current transformers require specialized installation. They are fairly cumbersome and have limited measurement dynamic.

Other devices use an induction type, Hall-effect sensor or similar device located in the narrow gap on a magnetic circuit around which the coiled electrical conductor is wound in which the intensity of the current traversing it will be measured. When it is traversed by the lines of the magnetic field induced by the current to be measured, this type of sensor delivers a voltage signal at its terminals that is representative of the current intensity. However, these induction sensors are particularly susceptible to nearby or parasitic magnetic fields which will falsify the measurement of intensity. It is possible to overcome this problem by increasing the section of the magnetic circuit, but this enlarges its size. Furthermore, this type of sensor has a very limited measurement dynamic when used in an open loop configuration. This dynamic can be improved appreciably by using a closed loop configuration where a compensating winding nullifies the field in the gap, since the current passing through the compensating winding then becomes the image of the primary current. However, this type of sensor requires a relatively powerful supply in order to furnish the compensation current.

Other devices use the Rogowski principle, which consists of a coil in the air placed around an electric conductor traversed by a current to be measured, the coil possibly being formed of one or more electrical coils connected in a series. The absence of a magnetic core risking saturation allows for a large measurement dynamic. Nevertheless, using high quality Rogowski coils in industry is very complex, costly, and hard to replicate because these coils require the linear density of the windings to be constant, as well as the section of the windings. Additionally, constructing an open measurement device, that is, one made in two sections to facilitate positioning it around an existing electric conductor, is also delicate since regularity of the windings is essential to the quality of such a device.

Other devices such as those described in publications EP 0 438 616 and EP 1 450 176 furnish a measurement of intensity by measuring a selective magnetic field in the narrow gap on a very thick magnetic circuit.

It is clear from the state of the art that no known device for measuring the intensity of a current is configured so as to be integrated with a standard electrical apparatus of reduced size such as a shutoff device. In this type of device, the space available between the electric conductors entering and leaving the device is relatively small, for example, of the order of 15-30 mm, making it impossible to position existing measurement devices on each conductor. Moreover, the proximity of the electrical conductors necessarily induces parasitic fields that falsify measurements. Furthermore, known devices have a limited measurement dynamic since they are designed for a specific measurement application. Therefore, they cannot be used for complementary energy metering applications and/or for surge protection, for which the range of intensity measured is multiplied by a coefficient of at least 10.

SUMMARY OF THE INVENTION

The present invention proposes a solution to this problem with a device for measuring current intensity having a simple, economic design, compact size for easy integration with any type of electric apparatus, offering high measurement dynamic, versatility, and the ability to measure and meter energy and/or provide surge protection as needed, the device being insensitive to parasitic fields as well as to the position of the electric conductor to be measured, and capable of construction in at least two sections to facilitate placement.

For this purpose, the invention concerns a measurement device of the type described in the preamble characterized in that the magnetic circuit is open and defines at least two wide gaps, each one closed by an electric coil such that the magnetic circuit and the electric coils define a closed path for circulation of the magnetic field, the width of the gap being at least twice the thickness of the magnetic circuit.

In a preferred form of the invention, the closed path is shaped generally like a parallelogram and the magnetic circuit is formed of two magnetic elements disposed on either side of the conductor and two coils disposed in the gap in the magnetic elements on either side of the conductor.

In another variation of the invention, the closed path may be shaped generally like a polygon and the magnetic circuit formed of a number N of magnetic elements disposed around the conductor and a number N of coils disposed in the gap in the magnetic elements around the conductor.

The coils are advantageously identical, attached in opposition and electrically connected in a series so that their useful fields are increased and their parasitic fields are canceled. Preferably each coil is made in the form of a printed circuit. In this case the windings of the coil may be engraved on the substrate of the printed circuit to form windings that are parallel to one another, each winding comprising at least one upper line and one lower line that are rectilinear and parallel, at least one of the lines on each winding comprising an end portion that is angled relative to the line in order to connect the windings to one another. In a variation, the device may comprise a voltage measurement means using a resistance or condenser bridge attached to the printed circuit used to form the coil.

In the preferred embodiment, the magnetic circuit is made of ferromagnetic materials of high magnetic permeability so that the magnetic field induced by the current to be measured is negligible in the magnetic circuit relative to the magnetic field in the coil or coils.

This device advantageously comprises at least one supporting platform to which the magnetic circuit and coils are attached, the supporting platform comprising at least one opening for the conductor to pass through and at least one connecting electric circuit to connect the coils to the processing module.

Preferably, this device is designed to individually measure the intensity of current circulating in several conductors and in this case, it comprises several identical measurement structures, each of which comprises at least one magnetic circuit and at least two electric coils, with the supporting platform possibly being common to all the measurement structures.

This measurement device may consist of a single unit element through which the conductor is threaded, or advantageously of at least two elements assembled around the conductor when the device is placed in the electrical installation.

The invention further concerns an electric apparatus such as the one defined in the preamble characterized in that it comprises at least one measurement device like the one defined above for measuring current intensity in at least one of the electric conductors supplying the apparatus.

SUMMARY DESCRIPTION OF THE DRAWINGS

The present invention and its features will be clearer from the following description of several embodiments provided by way of non-limiting examples, with reference to the attached drawings, in which.

Figure 7A:
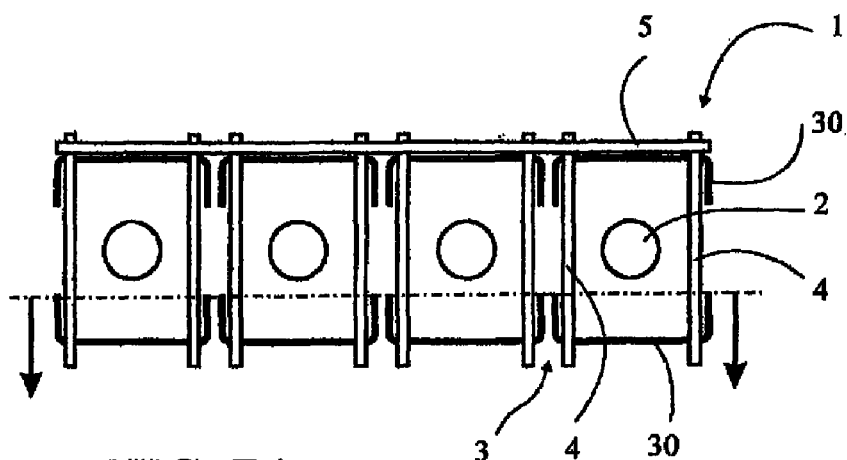
Figure 7B:
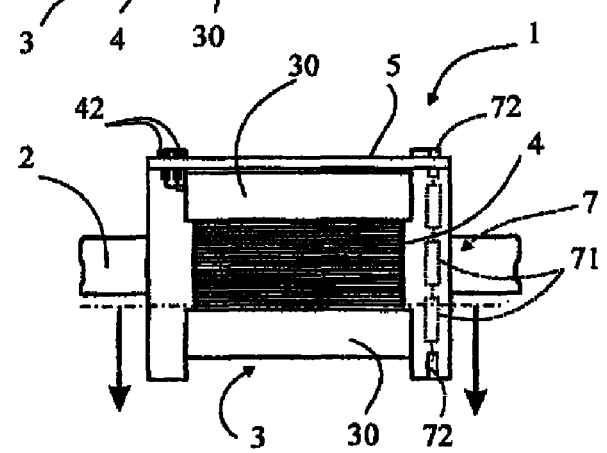
Figure 7C:
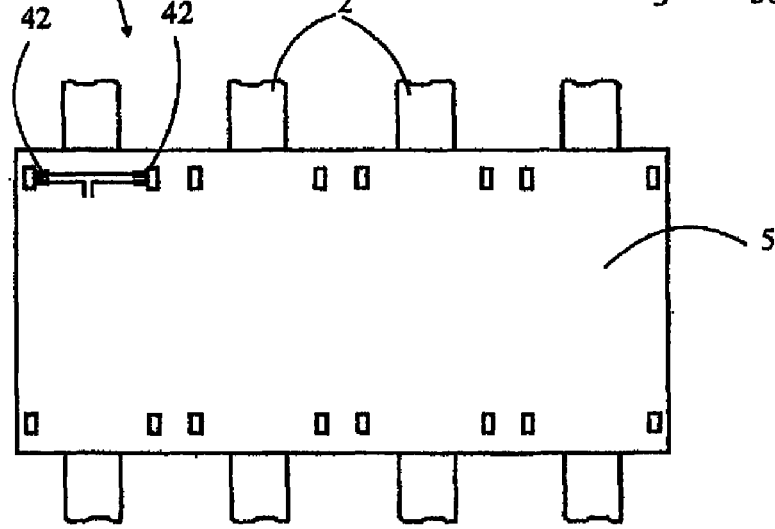

FIGS. 7A, 7B and 7C, respectively, are front, side, and top views of a variation of a measurement device according to the invention.

ILLUSTRATIONS OF THE INVENTION

Figure 1:
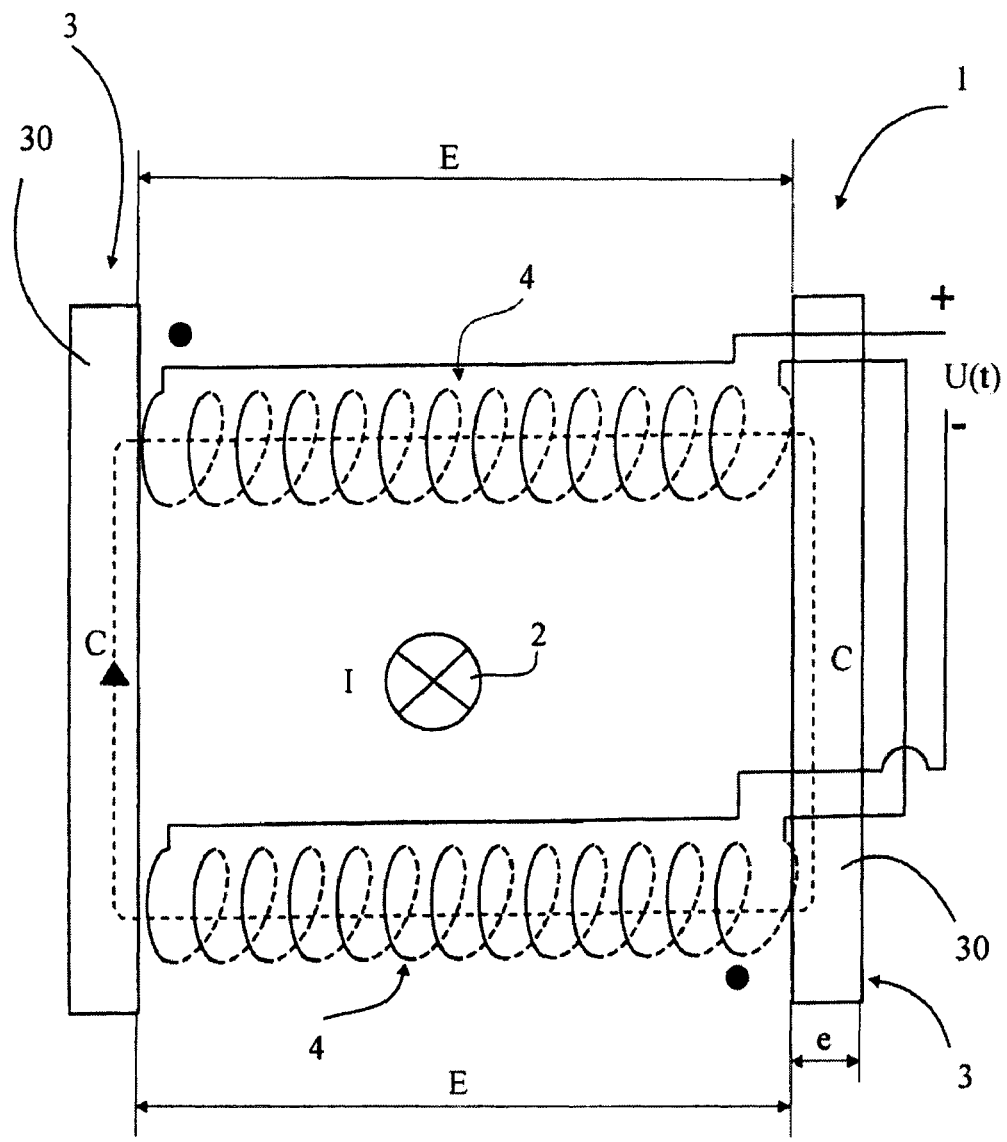
FIG. 1 is a schematic representation of the principle of the measurement device according to the invention.

The principle of measurement device 1 according to the invention for measuring the intensity I of current passing through an electrical conductor 2 or a current line, hereafter called conductor 2, is illustrated in FIG. 1. It utilizes the magnetic field induced around conductor 2 by the current I to be measured. In the present invention, the circulation of the lines of this magnetic field is controlled on a closed path C, formed of at least one open magnetic circuit 3 and defining at least two gaps E closed by at least two electric coils 4, hereafter called coils 4, which are wound perpendicular to the direction in which the field circulates and which occupy more than one-third of closed path C. The Ampere theorem is applied to path C by decomposing the field circulating in the air through coils 4 and the field circulating in the magnetic circuit 3. If a magnetic circuit 3 with high magnetic permeability is chosen, the component of the magnetic field circulating in the magnetic circuit is negligible relative to the component of the magnetic field circulating in coil 4. Because of this, the voltage at the terminals of coil 4 is proportionate to the derivative of the intensity I of the current to be measured. Therefore, it is the quality of magnetic circuit 3 that will impact the performance of measurement device 1. For this reason, magnetic circuit 3 is made of ferromagnetic materials such as iron or nickel-based alloys or the like with high magnetic permeability. Thus, magnetic circuit 3 is not used to concentrate the magnetic field, but to control the distribution of its field lines and limit the field's influence in the areas not occupied by coils 4. This optimizes the response of coil 4 while simultaneously providing a measurement device 1 that is insensitive to external parasitic fields.

In measurement device 1 shown schematically in FIG. 1, magnetic circuit 3 is open and it comprises two magnetic elements in the form of plates 30 which may or may not be flat, are generally parallel and located on either side of conductor 2 separated by two wide gaps E. The field lines circulate in these plates 30 following a generally rectilinear path C parallel to the plates 30. Gaps E are characterized as "wide" in contrast to the "narrow" gaps known in magnetic circuits in general use. These gaps E are at least twice as wide as the thickness e of plates 30 and are wide enough to receive coils 4. They may range from 15 to 150 mm in size depending upon the application.

The measurement device 1 also comprises two generally parallel coils 4 located on either side of conductor 2 and extending inside each gap E between two plates 30 to close path C of the magnetic field without leaving any space free. The field lines circulate through coils 4 following a path C that is generally rectilinear and perpendicular to the coil windings. These two coils 4 are electrically connected in a series to deliver at their terminals an output voltage U(t) proportional to the derivative of the intensity I of the current to be measured. They are electrically identical, comprising the same number of windings, and are wound in opposite directions so that useful fields will be increased and parasitic fields canceled. Path C defined by this construction is therefore generally shaped like a parallelogram.

The sensitivity of measurement device 1 to parasitic fields and to the position of electrical conductor 2 is conditioned upon the relationship between the size of the useful surface of coils 4, such as the number of windings multiplied by the surface of each winding, and the size of the parasitic surfaces, in particular the surface of the return loops. While any type of coil 4 can be used in the invention, coils 4 made on printed circuits lend themselves particularly well to this application. This technology actually affords very good control over the geometry and regularity of the coils and considerably reduces parasitic surfaces at the level of the return loops, thanks to precise engraving procedures permitting the formation of tracks separated by 0.1 mm to 0.2 mm.

Given the fact that the construction and disposition of coils 4 confers immunity to parasitic fields, the section of magnetic circuit 3 and thus the entire size of measurement device 1 can be reduced considerably. In addition, the existence of a wide gap E also makes measurement device 1 less sensitive to variations in the dimension of this gap E.

Moreover, the wide gap E effectively limits induction in the magnetic material and consequently allows an extended measurement dynamic relative to currently used devices which have narrow gaps. This results in a measurement device 1 with a high measurement dynamic extending, for example, from 1 A to 1600 A for a given caliber of 63 A to 160 A and allows the combined applications of measurement, protection and energy metering.

Figure 2:
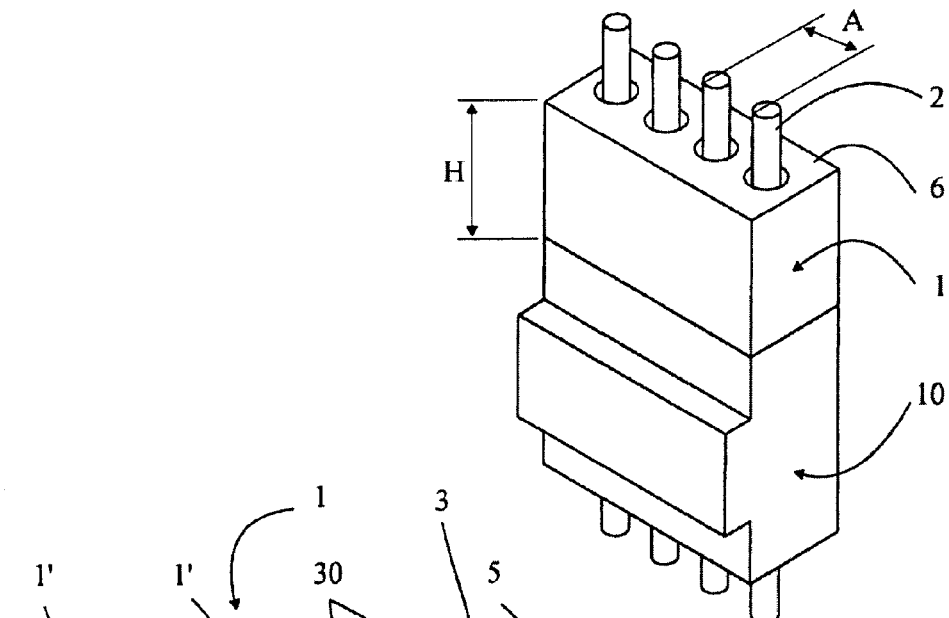
FIG. 2 is a simplified perspective view of one example of an electric apparatus equipped with a measurement device according to the invention.
Figure 3:
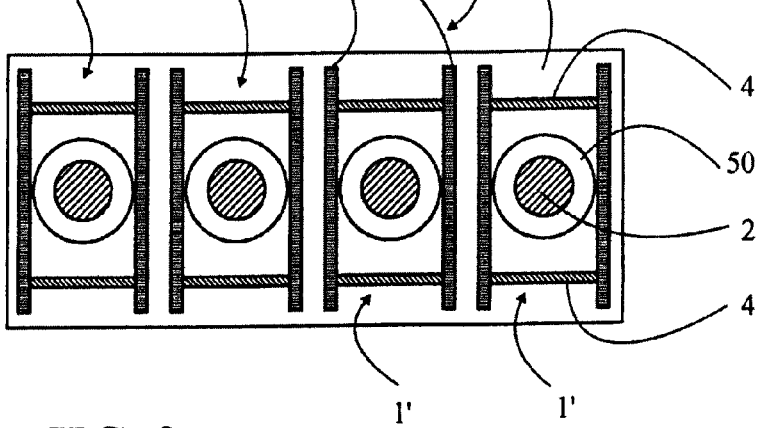
FIG. 3 is a cross-section of the measurement device of FIG. 2.
Figure 4:
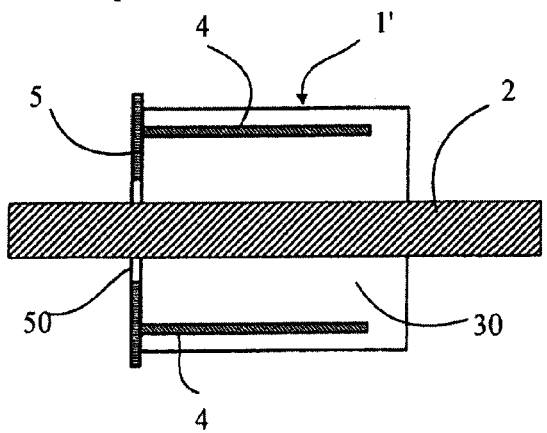
FIG. 4 is a cross-section along line IV-IV of the measurement device of FIG. 3.

The concept as defined above allows very narrow and compact measurement devices 1 to easily be constructed, integrating perfectly either inside or on an electric apparatus 10, one example of which is given with reference to FIGS. 2 through 4. Depending upon need, it is possible to propose measurement devices 1 in a single unit version (made of one piece) through which conductors 2 must be threaded, and in a dismountable version (made in at least two pieces) facilitating attachment to existing conductors 2.

Measurement device 1 according to the invention is completed by a module (not shown) for processing the output voltage U(t) of coils 4 in order to deliver a value I for measured intensity. Conventionally, this processing module is an integrator to which a phase compensation stage can be added with a capacitor connection to suppress the output offset and noise in order to improve stability. This processing module or any other equivalent module is not the subject of the present invention and will not be described in detail.

Measurement device 1 according to the invention may also be completed by a device for measuring voltage 7 at the terminals of a resistance or condenser bridge 71 attached to a printed circuit 40 used to form coils 4 as explained below. In this way a combined intensity/voltage sensor is obtained using the same measurement device 1 (see dotted line portion of FIG. 7B) measuring the current intensity passing through electrical conductor 2 and simultaneously the voltage of this conductor, perhaps for the purpose of constructing an energy meter, a power transducer, or a combined current/voltage control apparatus used for surveillance of electric networks. Resistance or condenser bridge 71 is connected by connecting areas 72 on one side to the processing module (not shown) via supporting platform 5 and on the other side, to conductor 2 itself by a wire connection (not shown) or the like.

In other variations that are not shown, measurement device 1 of the invention may comprise an open magnetic circuit 3 of a different form with several gaps E, each gap being closed by a coil 4 and defining a polygonal path C.

Best Way to Achieve the Invention

FIGS. 3 and 4 show a preferred example of measurement device 1 according to the invention designed for attachment to an electric apparatus 10 as shown in FIG. 2. This electric apparatus 10 may be an electric shutoff device such as a switch, a commutator switch, a circuit breaker or the like, monophase or multiphase, with or without a neutral. In the example shown electrical apparatus 10 comprises four conductors 2, three with phases and one neutral. The interval A between two consecutive conductors 2 is relatively small, for example, ranging from 15 to 50 mm depending on the type of apparatus, which leaves little space available for placing a measurement device 1 on each electric conductor 2. Similarly, the space available H is limited due to the constraints of connecting conductors 2 to the various electric circuits or apparatuses upstream and/or downstream, ranging, for example, from 30 to 80 mm.

Measurement device 1 attached to electric apparatus 10 comprises as many identical measurement structures 1' as conductors 2. Each measurement structure 1' comprises around each conductor 2 a closed path C for circulation of the lines of the magnetic field consisting of two parallel plates 30 and two coils 4 located in gap E as in the principle illustrated in FIG. 1. Each measurement structure 1' is attached to a supporting plate 5 that comprises connecting electrical circuits (not shown) for connecting coils 4 to the processing module (not shown). Each supporting plate 5 comprises openings 50 forming passages for each conductor 2. This measurement device 1 is housed in an insulating case 6.

Figure 5:
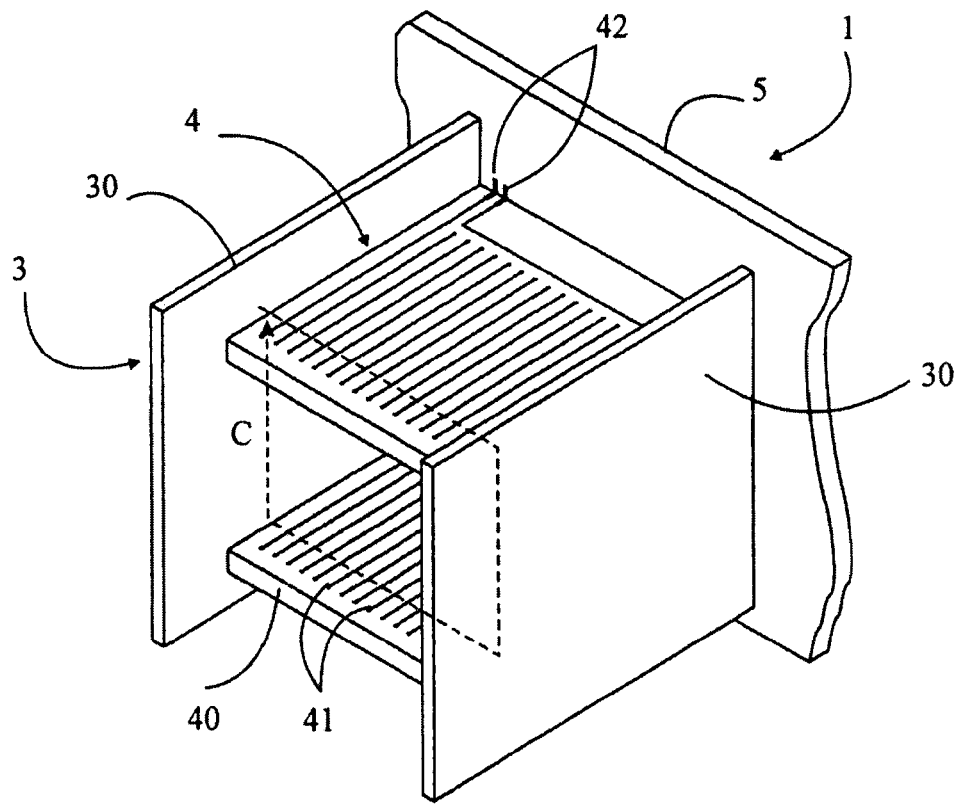
FIG. 5 is a perspective view of a portion of the measurement device of FIG. 3.

With particular reference to FIG. 5, each coil 4 is made in the form of a printed circuit 40. It comprises windings that are parallel to one another and orthogonal relative to path C followed by the lines of the magnetic field induced by the current to be measured. The two electric coils 4 are opposed and connected in a series as explained below. The substrate used to make printed circuits 40 is thin, of the order of 1-3 mm. The substrate thickness is selected so as to maximize the ratio between the linear density of the windings and this thickness, which is, for example, equal to 1.6 mm for a printed circuit made using standard technology.

Figure 6:
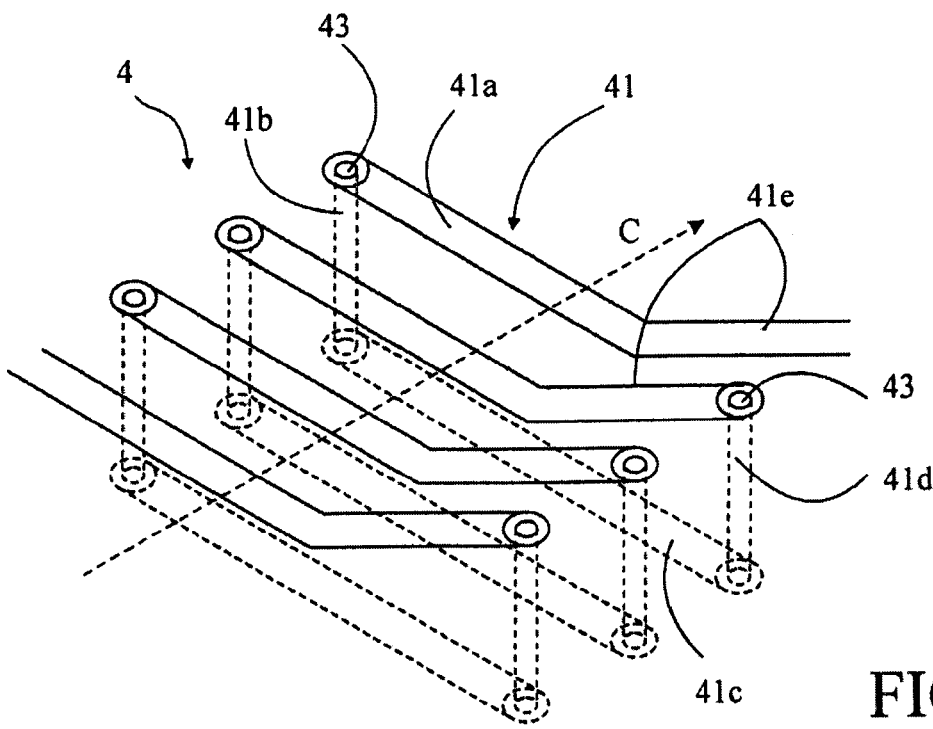
FIG. 6 is an enlarged perspective of an example of the coil system.

An example of the design of the coil windings 41 is shown in FIG. 6, which has been enlarged and is intentionally disproportionate to facilitate understanding. Each winding 41 engraved on the substrate comprises an upper rectilinear line 41$a$, a first return loop 41$b$ traversing the substrate through a first connecting hole 43 perpendicular to the substrate, a lower rectilinear line 41$c$ parallel to upper line 41$a$, and a second return loop 41$d$ traversing the substrate through a second connecting hole 43 perpendicular to the substrate. In order to allow windings 41 to be made parallel to one another, upper line 41 on each winding comprises an end portion 41$e$ that is angled relative to the line to begin its return loop 41$d$ in the neighboring connecting hole 43, and so forth, with angled end portions 41$e$ being parallel to one another. Obviously, other equivalent designs would work as well.

FIGS. 7A, 7B and 7C illustrate an "opening" version of measurement device 1 according to the invention that can be encased around electric conductors 3 rather than wired when the device is being placed in the electrical installation. In this example the configuration of magnetic circuits 3 is reversed: plates 30 are parallel to supporting platform 5 and coils 4 are perpendicular to the platform. Supporting platform 5 supports a first arrangement of plates 30 as well as coils 4 which are connected directly to one another and to the connecting electric circuits provided on the platform 5. This measurement device 1 may become an opening device with no difficulty. It is only necessary for the second arrangement of plates 30, opposite supporting platform 5, to be attached to a movable or detachable portion of casing 6.

Possible Industrial Applications

It is clear from this example that the invention achieves its stated goals and that it can be produced industrially using production techniques known in the field of manufacturing electric and electronic accessories.

The present invention is not limited to the exemplary embodiments described, but extends to any modification and variation obvious to a person skilled in the art while still remaining within the scope of protection defined by the attached claims.

The invention claimed is:

1. A device (1) for measuring an intensity (I) of an electric current, the device comprising at least one magnetic circuit (3) located near an electric conductor (2) traversed by a current to be measured for channeling a magnetic field induced around the conductor by the current to be measured, at least two electric coils (4) associated with the magnetic circuit (3) for delivering a voltage proportionate to a derivative of the intensity (I) of the current to be measured, and at least one module for processing the voltage to deliver a value for the intensity measured, the magnetic circuit (3) being open and defining at least two gaps (E), each gap (E) being closed by an electric coil (4) such that the magnetic circuit (3) and the electric coils (4) define a closed path (C) for circulation of the magnetic field, and the coils (4) disposed in the gaps (E) occupying more than one third of the closed path (C) characterized in that the coils (4) disposed in the gaps (E) are made from printed circuits (40) comprising windings (41) engraved on a substrate, the windings (41) comprise a plurality of loops and each of the loops comprises an upper line (41a) and a lower line (41c) which are supported on opposite surfaces of the respective substrate, ends of the upper and the lower lines (41a, 41c) are coupled by return lines (41b, 41d) with one of the return lines (41d) coupling adjacent loops, at least portions of the upper and the lower lines (41a, 41c) of the loops extend parallel to each other and perpendicular to a direction in which the magnetic field circulates, and in that the coils (4) are identical, attached in opposition and electrically connected in a series, so that their useful fields are increased and their parasitic fields are canceled.

2. The device according to claim 1, wherein the closed path (C) is generally shaped like a parallelogram.

3. The device according to claim 2, wherein the magnetic circuit (3) is formed from two plates (30) which are disposed on either side of the conductor (2) and two coils (4) which are disposed in the gap (E) in the plates on either side of the conductor (2).

4. The device according to claim 3, wherein the magnetic circuit (3) is formed of a number (N) of plates (30) which are disposed around the conductor (2) and a number (N) of coils (4) which are disposed in the gap (E) in the plates around the conductor (2).

5. The device according to claim 1, wherein the closed path (C) is generally shaped like a polygon.

6. The device according to claim 1, wherein the upper line (41a) and the lower line (41c) are rectilinear to one another, at least one of the upper and the lower lines (41a, 41c) on each winding (41) comprises an end portion (41e) that is angled relative to the at least one of the upper and the lower lines (41a, 41c) to connect the windings to one another.

7. The device according to claim 1, wherein the device comprises a means for measuring voltage (7) using one of a resistance and a condenser bridge (71) attached on the printed circuit (40) that form the coil (4).

8. The device according to claim 1 wherein the gap (E) is at least twice as wide as a thickness (e) of the magnetic circuit (3).

9. The device according to claim 1, wherein the magnetic circuit (3) is made of a ferromagnetic material with magnetic permeability allowing the magnetic field induced by the current to be measured being negligible within the magnetic circuit (3) relative to the magnetic field in the coils (4).

10. The device according to claim 1, wherein the device comprises at least one supporting platform (5) to which the magnetic circuit (3) and the coils (4) are attached, and the supporting platform (5) comprises at least one connecting electric circuit which connects the coils (4) to the processing module.

11. The device according to claim 10, wherein the supporting platform (5) comprises at least, one opening (50) for passage of the conductor (2).

12. The device according to claim 10, wherein the device individually measures the intensity (I) of the current circulating in several conductors (2) and comprises several identical measurement structures (1') each of which comprise at least one magnetic circuit (3) and at least two electric coils (4).

13. The device according to claim 12, wherein the device comprises one supporting platform (5) common to the measurement structures (1').

14. The device according to claim 1, wherein the device is a single unit piece through which the conductor (2) is threaded.

15. The device according to claim 1, wherein the device comprises at least two pieces assembled around the conductor (2).

16. The device according to claim 1, wherein one of the upper line (41a) and the lower line (41c) of each of the windings (41) comprises a first linear portion and a second linear portion (41e), the first linear portion extending parallel to the other one of the upper line and the lower line of each of the windings and perpendicular to the direction in which the magnetic field circulates, the second linear portion (41e) extends at an angle with respect to the first linear portion.

17. An electric apparatus (10) supplied by at least two electric conductors (2), the apparatus comprising at least one measurement device (1) for measuring an intensity (I) of electric current in at least one of the electric conductors (2), the measurement device comprising at least one open magnetic circuit (3) defining at least two wide gaps (E), each of the gaps being closed by an electric coil (4), the magnetic circuit (3) and the electric coils (4) defining a closed path (C) for the circulation of a magnetic field, the electric coils (4) disposed in the gaps (E) being in the form of printed circuits (40) and comprising windings (41) engraved on a substrate, the windings (41) comprise a plurality of loops and each of the loops comprises an upper line (41a) and a lower line (41c) which are supported on opposite surfaces of the respective substrate, ends of the upper and the lower lines (41a, 41c) are coupled by return lines (41b, 41d) with one of the return lines (41d) coupling adjacent loops, portions of the upper and the lower lines (41a, 41c) of the loops extend parallel to each other and perpendicular to a direction of circulation of the magnetic field, and the coils (4) occupy more than one-third of the closed path (C), and the coils (4) each have the same number of windings, which are wound in opposite directions, and are electrically connected in a series such that their useful fields are increased and their parasitic fields are canceled.

18. The device according to claim 17, wherein the upper line (41a) of each of the windings (41) comprises first and second linear portions, the first linear portion of the upper lines (41a) extends parallel to the lower lines of the winding and perpendicular to the direction in which the magnetic field circulates, the first and the second linear portions (41e) extend at an angle with respect to each other.

19. A device (1) for measuring an intensity (I) of an electric current, the device comprising two magnetic plates (30) and two electric coils (4), the two magnetic plates (30) support opposite ends of the two electric coils (4) such that a first end of the electric coils (4) contacts one of the two magnetic plates (30) and a second end of the electric coils (4) contacts the other of the two magnetic plates (30), the two magnetic plates (30) are spaced from each other by the two electric coils (4) which define a gap (E) between the two magnetic plates (30), the two electric coils (4) supported by the two magnetic plates (30) such that the two electric coils are parallel to each other, each of the two electric coils (4) is made from a printed circuits (40) which comprise windings (41) engraved on a substrate, the windings (41) comprise a plurality of loops and each of the loops comprises an upper line (41a) and a lower line (41c) which are supported on opposite surfaces of the respective substrate, ends of the upper and the lower lines (41a, 41c) are coupled by return lines (41b, 41d) with one of the return lines (41d) coupling adjacent loops, the upper and the lower lines (41a, 41c) of the loops extend parallel to each other and parallel to each of the two magnetic plates (30), an electrical conductor (2) extends into the gap (E) centrally between each of the two magnetic plates (30) and the two electric coils (4) and parallel to the plurality of loops, a current, which is to be measured, passes through the electrical conductor (2) and induces a magnetic field around the electrical conductor (2) the two electric coils (4) deliver a voltage proportionate to a derivative of the intensity (I) of the current to be measured, and at least one module processes a voltage to determine the intensity to be measured, the two magnetic plates (30) and the two electric coils (4) define a closed path (C) for circulation of the magnetic field, and the two electric coils (4) disposed in the gaps (E) span more than one third of the closed path (C), the upper and the lower lines (41*a*, 41*c*) of the loops extend perpendicular to a direction in which the magnetic field circulates and the two electric coils (4) are electrically connected in a series, so that their useful fields are enhanced and their parasitic fields are canceled.

* * * * *